US011861124B2

(12) United States Patent
Xiang et al.

(10) Patent No.: US 11,861,124 B2
(45) Date of Patent: Jan. 2, 2024

(54) TOUCH-CONTROL PANEL AND PREPARATION METHOD THEREFOR, AND DISPLAY APPARATUS

(71) Applicant: BOE Technology Group Co., Ltd., Beijing (CN)

(72) Inventors: Dalin Xiang, Beijing (CN); Zewen Bo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 9 days.

(21) Appl. No.: 17/760,771

(22) PCT Filed: May 21, 2021

(86) PCT No.: PCT/CN2021/095167
§ 371 (c)(1),
(2) Date: Mar. 16, 2022

(87) PCT Pub. No.: WO2021/238795
PCT Pub. Date: Dec. 2, 2021

(65) Prior Publication Data
US 2022/0342511 A1 Oct. 27, 2022

(30) Foreign Application Priority Data
May 29, 2020 (CN) .......................... 202010477332.4

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *H10K 59/40* (2023.02);
(Continued)

(58) Field of Classification Search
CPC ... G06F 3/044–0448; G06F 3/041–047; G06F 2203/041–04114; H10K 59/40
See application file for complete search history.

(56) References Cited

U.S. PATENT DOCUMENTS

2017/0192563 A1 7/2017 Liao
2017/0277351 A1\* 9/2017 Lee ....................... G06F 3/0443
(Continued)

FOREIGN PATENT DOCUMENTS

CN 105426030 A 3/2016
CN 207924637 U 9/2018
(Continued)

OTHER PUBLICATIONS

International Search Report for PCT/CN2021/095167 dated Aug. 20, 2021.
(Continued)

*Primary Examiner* — Sanjiv D. Patel
(74) *Attorney, Agent, or Firm* — Ling Wu; Stephen Yang; Ling and Yang Intellectual Property

(57) ABSTRACT

Disclosed are a touch-control panel and a preparation method therefor, and a display apparatus. The touch-control panel comprises: a substrate, a plurality of first touch-control electrodes which are arranged on the substrate at intervals and extend in a first direction, and a plurality of second touch-control electrodes which are arranged on the substrate at intervals and extend in the first direction, wherein the first touch-control electrodes and the second touch-control electrodes are insulated from each other; the first touch-control electrodes and the second touch-control electrodes cross to form a first interdigital structure; and first bending parts extending towards the outer sides of the first touch-control electrodes are formed on side parts of the first touch-control electrodes, or, second bending parts extending towards the
(Continued)

outer sides of the second touch-control electrodes are formed on side parts of the second touch-control electrodes.

12 Claims, 3 Drawing Sheets

(51) Int. Cl.
  *H10K 59/40* (2023.01)
  *H10K 77/10* (2023.01)
(52) U.S. Cl.
  CPC .. *H10K 77/111* (2023.02); *G06F 2203/04102* (2013.01); *G06F 2203/04103* (2013.01); *G06F 2203/04111* (2013.01); *G06F 2203/04112* (2013.01)

(56) References Cited

U.S. PATENT DOCUMENTS

| | | | |
|---|---|---|---|
| 2019/0107911 | A1 | 4/2019 | Zhai |
| 2019/0258343 | A1* | 8/2019 | Hwang ................. G06F 3/0445 |
| 2020/0073514 | A1* | 3/2020 | Kuo ........................ G06F 3/041 |

FOREIGN PATENT DOCUMENTS

| | | |
|---|---|---|
| CN | 108803945 A | 11/2018 |
| CN | 111638812 A | 9/2020 |

OTHER PUBLICATIONS

The First Office Action dated Sep. 22, 2021 for Chinese Patent Application No. 202010477332.4 and English Translation.

* cited by examiner

TOUCH-CONTROL PANEL AND PREPARATION METHOD THEREFOR, AND DISPLAY APPARATUS

CROSS-REFERENCE TO RELATED APPLICATIONS

The present application is a U.S. National Phase Entry of International Application PCT/CN2021/095167 having an international filing date of May 21, 2021, which claims priority of Chinese Patent Application No. 202010477332.4, filed to the CNIPA on May 29, 2020 and entitled "Touch-control Panel and Preparation Method Therefor, and Display Apparatus", the contents of which should be interpreted as being hereby incorporated by reference.

TECHNICAL FIELD

Embodiments of the present disclosure relate to, but are not limited to, the field of touch technologies, and in particular to a touch panel, a method for preparing the touch panel, and a display apparatus.

BACKGROUND

Organic Light Emitting Diode (OLED) is an active light emitting display device, which has advantages such as self-illumination, wide view angle, high contrast, low power consumption, wide color gamut, lightness and thinness, and ability of being specially shaped. With continuous development of display technology, the OLED technology is increasingly applied in flexible display and transparent display. Transparent display is an important branch of the display technology, which refers to displaying images in a transparent state, in which a viewer can see not only images in a display apparatus, but also scenes behind the display apparatus, and Virtual Reality (VR)/Augmented Reality (AR) and 3D display functions can be implemented.

With development of flexible display technology, especially development of rolling and curling technology, higher requirements are put forward on touch panels, wherein an on-cell touch (touch electrodes are provided on an upper glass substrate of a display panel) scheme has obvious technical advantages, and has advantages such as small RC (resistance-capacitance) delay, no shading and small thickness and the like, which is more conducive to folding and rolling.

SUMMARY

The following is a summary of subject matters described in the present disclosure in detail. The summary is not intended to limit the scope of protection of claims.

The existing display substrate is designed with curved surfaces at its periphery. For example, as shown in FIG. 1, curved surfaces 10 are formed on edges of the display substrate. Alternatively, as shown in FIG. 2, curved surfaces 10 are formed at corners of the display substrate. When an add-on touch screen is attached to a display substrate with curved surface, there are risks such as poor alignment accuracy, stretch damage and cracking of other film layers.

In order to increase tensile deformation amount of the add-on touch screen, the existing add-on touch screen has a groove design, which is convenient for stretching and attaching the touch screen, while reducing damages to key components of the touch screen during stretching. There are horizontal and vertical grooves on the touch screen, which leads to problems such as single trace of touch metal grid, poor communication between grids, high trace resistance, RC delay. In addition, the existence of grooves also results in problems such as large spacing between metal grids, low basic mutual capacitance value, low touch variation quantity when a touch occurs and poor touch accuracy.

In a first aspect, an embodiment of the present disclosure provides a touch panel, which includes a base substrate, multiple first touch electrodes which are provided on the base substrate at intervals and extend along a first direction and multiple second touch electrodes which are provided at intervals and extend along the first direction, wherein the first touch electrodes and the second touch electrodes are insulated from each other, and the first touch electrodes and the second touch electrodes cross each other to form a first interdigital structure. A first bending part extending toward an outer side of a first touch electrode is formed on a side part of the first touch electrode, or, a second bending part extending toward an outer side of a second touch electrode is formed on a side part of the second touch electrode.

In an exemplary implementation, the first bending part extending toward the outer side of the first touch electrode is formed on the side part of the first touch electrode, and the second bending part extending toward the outer side of the second touch electrode is formed on the side part of the second touch electrode.

In an exemplary implementation, the first bending part is located at the side part of the first touch electrode close to the second touch electrode, and the second bending part is located at the side part of the second touch electrode close to the first touch electrode, and the first bending part and the second bending part cross each other to form a second interdigital structure.

In an exemplary implementation, it further includes multiple first connection electrodes which are provided on the base substrate at intervals and extend along a second direction, and each first connection electrodes are provided with multiple first touch electrodes provided at intervals, and the first touch electrodes are electrically communicated through the first connection electrode.

In an exemplary implementation, at least two second connection electrodes are connected between adjacent first connection electrodes, and the second connection electrodes are located on opposite sides of the first touch electrodes on the first connection electrodes, and the adjacent first connection electrodes and the second connection electrodes form a loop structure.

In an exemplary implementation, multiple third connection electrodes which are provided on the base substrate at intervals and extend along the second direction are further included, wherein each third connection electrodes are provided with multiple second touch electrodes provided at intervals, and the second touch electrodes are electrically communicated through the third connection electrode.

In an exemplary implementation, the second touch electrodes adjacent to each other along the first direction are communicated through a bridging structure.

In an exemplary implementation, at least two bridging structures are provided on the touch panel.

In an exemplary implementation, grooves provided on the base substrate are further included, wherein an orthogonal projection of the first touch electrodes and the second touch electrodes on the base substrate does not overlap with an orthogonal projection of the grooves on the base substrate, and the first touch electrodes and/or the second touch electrodes form the first bending parts and/or the second bending parts at the grooves.

In an exemplary implementation, a floating electrode provided on the base substrate is further included, and the floating electrode is disposed on a same layer as the first touch electrodes and the second touch electrodes, and is insulated from the first touch electrodes and the second touch electrodes.

In an exemplary implementation, both the first touch electrodes and the second touch electrodes are in a grid structure.

In an exemplary implementation, multiple sub-pixels provided on the base substrate are further included, wherein the grid structure is provided on the sub-pixels. In the grid structure, each grid corresponds to one or one group of sub-pixels, and a projection of the one or the group of sub-pixels on a plane where the grid is located falls within a corresponding grid.

In a second aspect, an exemplary embodiment of the present disclosure further provides a display apparatus including the aforementioned touch panel.

In a third aspect, an embodiment of the present disclosure further provides a method for preparing a touch panel, including:

forming, on a base substrate, multiple first touch electrodes which are provided at intervals and extend along a first direction and multiple second touch electrodes which are provided at intervals and extend along the first direction;

wherein the first touch electrodes and the second touch electrodes are insulated from each other, and the first touch electrodes and the second touch electrodes cross each other to form a first interdigital structure, and a first bending part extending toward an outer side of a first touch electrode is formed on a side part of the first touch electrode, or, a second bending part extending toward an outer side of a second touch electrode is formed on a side part of the second touch electrode.

Other aspects may be understood upon reading and understanding of the accompanying drawings and detailed descriptions.

DETAILED DESCRIPTION

Figure 1:
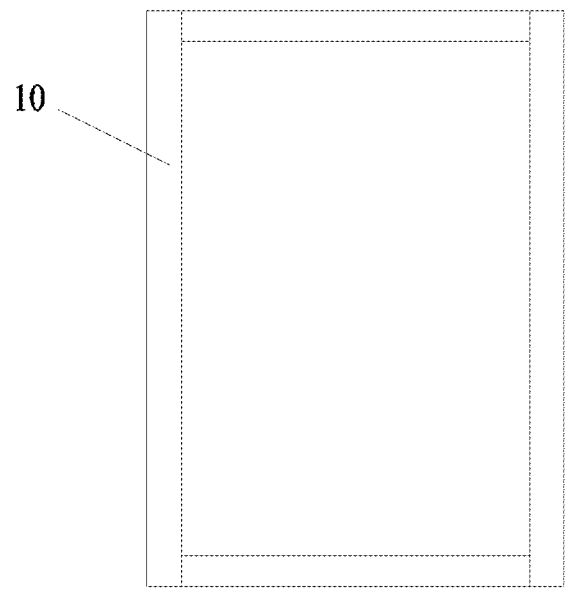
FIG. 1 is a first top view of a display substrate.
Figure 2:
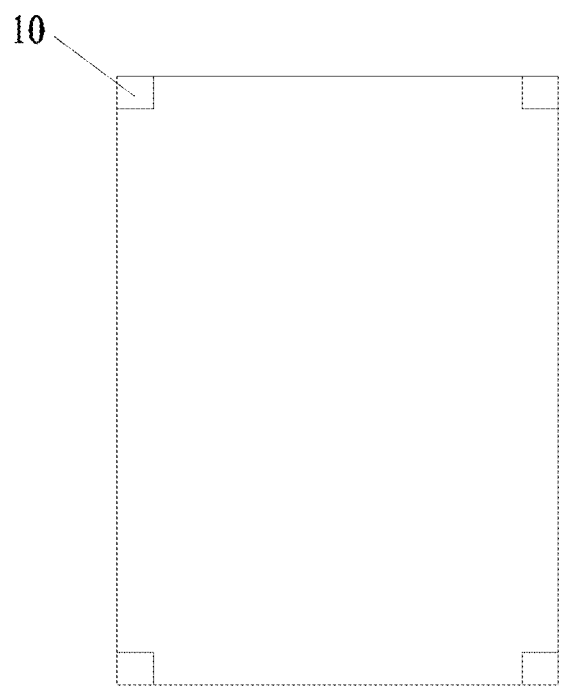
FIG. 2 is a second top view of a display substrate.

Embodiments of the present disclosure will be described in detail below with reference to accompanying drawings. It is noted that implementation modes may be implemented in multiple different forms. Those of ordinary skills in the art may easily understand such a fact that implementation modes and contents may be transformed into various forms without departing from spirit and scope of the present disclosure. Therefore, the present disclosure should not be construed as only being limited to the contents recorded in the following implementation modes. The embodiments in the present disclosure and features in the embodiments may be combined randomly with each other if there is no conflict.

In the specification, for convenience, wordings indicating orientations or positional relationships, such as "center", "upper", "lower", "front", "back", "vertical", "horizontal", "top", "bottom", "inside", and "outside", are used for describing positional relationships between constituent elements with reference to the accompanying drawings, which are merely for facilitating describing the specification and simplifying the description, rather than indicating or implying that referred apparatuses or elements must have particular orientations, and be constructed and operated in particular orientations. Thus, they cannot be construed as limitations on the present disclosure. The positional relationships between the constituent elements appropriately change according to directions according to which the constituent elements are described. Therefore, they are not limited to the wordings described in the specification, which may be replaced appropriately according to a situation.

In the specification, unless otherwise specified and defined explicitly, terms "mounted", "mutually connected", and "connection" should be understood in a broad sense. For example, a connection may be a fixed connection, or a detachable connection, or an integral connection, it may be a mechanical connection or an electrical connection, it may be a direct connection, or an indirect connection through an intermediate, or an internal communication between two elements. Those of ordinary skills in the art may understand the meanings of the above terms in the present disclosure according to situations.

In the present disclosure, "about" refers to that a boundary is defined not so strictly and numerical values in process and measurement error ranges are allowed.

A main structure of a touch panel according to an embodiment of the present disclosure includes: a base substrate, multiple first touch electrodes which are provided on the base substrate at intervals and extend along a first direction, and multiple second touch electrodes which are provided at intervals and extend along the first direction. The first touch electrodes and the second touch electrodes are insulated from each other, and the first touch electrodes and the second touch electrodes cross each other to form a first interdigital structure. First bending parts extending toward outer sides of the first touch electrodes are formed on side parts of the first touch electrodes respectively. Alternatively, second bending parts extending toward outer sides of the second touch electrodes are formed on side parts of the second touch electrodes respectively.

In some embodiments, first bending parts are formed on side parts of the first touch electrodes, and second bending parts are formed on side parts of the second touch electrodes.

According to the touch panel of the embodiment of the present disclosure, the first interdigital structure is formed by the first touch electrodes and the second touch electrodes, which results in increased extension lengths of the first touch electrodes and the second touch electrodes, an increased mutual capacitance inductance during touching, and an improved sensitivity of the touch panel.

According to the touch panel of the embodiment of the present disclosure, the first bending parts are formed on the side parts of the first touch electrodes, and/or the second bending parts are formed on the side parts of the second touch electrodes, so that the extension lengths of the first touch electrodes and the second touch electrodes, the mutual capacitance inductance during touching, and the sensitivity of the touch panel are further increased.

Figure 3:
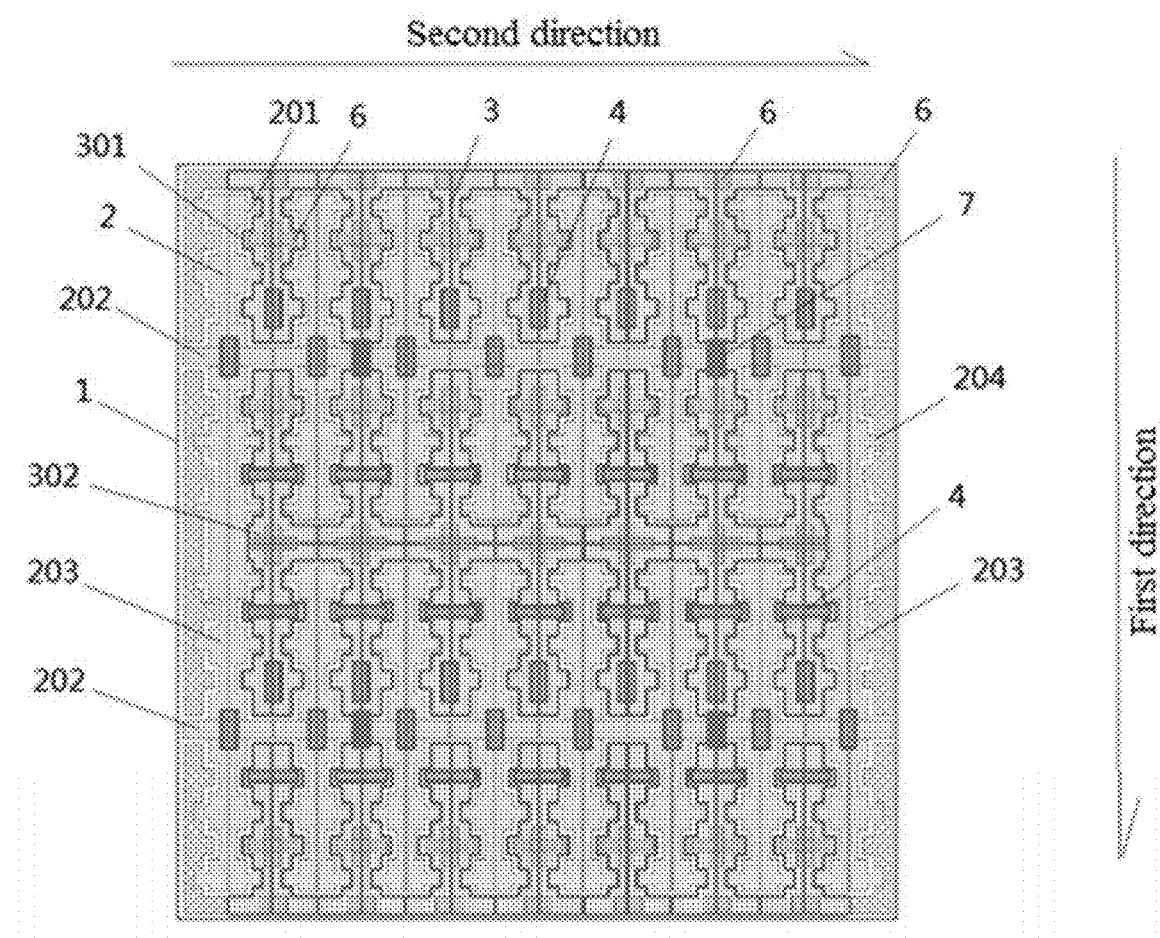
FIG. 3 is top view of a touch panel according to an embodiment of the present disclosure.

FIG. 3 is a top view of a touch panel according to an embodiment of the present disclosure. As shown in FIG. 3, a planar structure of the touch panel includes a base substrate 1, multiple first touch electrodes 2 which are provided on the base substrate 1 at intervals and extend along a first direction and multiple second touch electrodes 3 which are provided on the base substrate 1 at intervals and extend along the first direction, wherein the first touch electrodes 2 and the second touch electrodes 3 are insulated from each other. The first touch electrodes 2 and the second touch electrodes 3 cross each other to form a first interdigital structure, and the first touch electrodes 2 and the second touch electrodes 3 are alternately provided along a second direction. First bending parts 201 extending toward outer sides of the first touch electrodes 2 are formed on side parts of the first touch electrodes 2 respectively, and second bending parts 301 extending toward outer sides of the second touch electrodes 3 is formed on side parts of the second touch electrodes 3 respectively. In the embodiment, the first bending parts 201 and the second bending parts 301 extend along a second direction. The first direction intersects with the second direction, for example, the first direction is perpendicular to the second direction.

In an exemplary embodiment, the first touch electrodes 2 in the first direction are all respectively located in gaps formed by the second touch electrodes 3 in the first direction, and similarly, the second touch electrodes 3 in the first direction are all respectively located in gaps formed by the first touch electrodes 2 in the first direction, thus constituting the first interdigital structure.

As shown in FIG. 3, each first bending part 201 is located at a side part of a first touch electrode 2 closing to a second touch electrode 3, that is, the first bending part 201 is located between the first touch electrode 2 and the second touch electrode 3. A second bending part 301 is located at a side part a second touch electrode 3 closing to a first touch electrode 2, that is, the second bending part 301 is located between the first touch electrode 2 and the second touch electrode 3. The first bending parts 201 and the second bending parts 301 cross each other to form a second interdigital structure. Moreover, the first bending parts 201 and the second bending parts 301 are alternately provided along the first direction. According to the embodiment of the present disclosure, the second interdigital structure is formed by the first bending part 201 and the second bending part 301, thereby further increasing the mutual capacitance inductance during touching and improving the sensitivity of the touch panel.

In an exemplary embodiment, the first bending parts 201 are all respectively located in gaps formed by the second bending parts 301, and similarly, the second bending parts 301 are all respectively located in gaps formed by the first bending parts 201, thus constituting the second interdigital structure.

As shown in FIG. 3, the touch panel of the embodiment of the present disclosure further includes multiple first connection electrodes 202 which are provided on the base substrate 1 at intervals and extend along the second direction, and multiple first touch electrodes 2 arranged at intervals along the second direction are disposed on the first connection electrodes 202 respectively. The first touch electrodes 2 on each first connection electrode 202 are electrically communicated through the first connection electrode 202, thereby reducing resistance of the first touch electrodes 2. In the embodiment, the base substrate 1 is provided with two first connection electrodes 202 extending along the second direction, and multiple first touch electrodes 2 arranged at intervals along the second direction are formed on two sides of each of the two first connection electrodes 202, respectively.

As shown in FIG. 3, two second connection electrodes 203 are connected between adjacent first connection electrodes 202, and the adjacent first connection electrodes 202 are electrically connected by the second connection electrodes 203. The two second connection electrodes 203 are located on opposite sides of the first touch electrode 2 on the first connection electrode 202, so that the adjacent first connection electrodes 202 and the two second connection electrodes 203 form a loop structure, thereby reducing the resistance of the first touch electrodes 2.

As shown in FIG. 3, third bending parts 204 are formed on the opposite sides of the second connection electrodes 203 respectively, wherein the third bending parts 204 can increase extension lengths of the second connection electrodes 203 and reduce resistance of the second connection electrodes 203.

As shown in FIG. 3, the touch panel of the embodiment of the present disclosure further includes multiple third connection electrodes 302 which are provided on the base substrate 1 at intervals and extend along the second direction, and multiple second touch electrodes 3 arranged at intervals along the second direction are provided on the third connection electrodes 302. The second touch electrodes 3 on each third connection electrodes 302 are electrically communicated through the third connection electrode 302, thereby reducing resistance of the second touch electrodes 3.

In an exemplary embodiment, the first connection electrodes 202, the second connection electrodes 203 and the third connection electrodes 302 may be disposed on a same layer as the first touch electrodes 2 and the second touch electrodes 3, by direct connection. The first connection electrodes 202, the second connection electrodes 203 and the third connection electrodes 302, may be disposed on the same or different layer as the first touch electrodes 2 and the second touch electrodes 3 by bridging connection.

As shown in FIG. 3, adjacent second touch electrodes 3 along the first direction are connected through bridging structures 7, thereby reducing the resistance of the second touch electrodes 3.

In an exemplary embodiment, the touch panel is provided with at least two bridging structures 7. For example, as shown in FIG. 3, the touch panel in the embodiment of the present disclosure is provided with four bridging structures 7.

As shown in FIG. 3, the touch panel of the embodiment of the present disclosure further includes multiple grooves 4 formed on the base substrate 1, and an orthogonal projection of the first touch electrodes 2 and the second touch electrodes 3 on the base substrate 1 does not overlap with an orthogonal projection of the grooves 4 on the base substrate 1, that is, the first touch electrode 2 and the second touch electrode 3 are routed in peripheral areas of the grooves 4. The first touch electrodes 2 and/or the second touch electrodes 3 form first bending parts 201 and/or second bending parts 301 at the grooves 4. For example, the first touch electrodes 2 and the second touch electrodes 3 form the first bending parts 201 and the second bending part 301 at the grooves 4. Alternatively, the first touch electrodes 2 form the first bending parts 201 at the grooves 4. Alternatively, the second touch electrodes 3 forms the second bending parts 301 at the grooves 4. The grooves 4 may be strip grooves extending along the first direction or strip grooves extending along the second direction.

In an exemplary embodiment, the grooves 4 are used for providing a deformation amount when the touch panel is deformed. Herein, the grooves 4 may have various shapes, such as rectangle, rhombus or irregular polygon, which is not limited in this embodiment.

According to the touch panel of the embodiment of the present disclosure, the grooves 4 are formed so that when the touch panel undergoes a flexible deformation (such as stretching, rolling and folding), the deformation amount is concentrated in the grooves 4, such that coupling capacitance areas of the first touch electrodes 2 and the second touch electrodes 3 are located in the non-groove area with smaller stretching deformation, thereby reducing variations of the coupling capacitance between the first touch electrodes 2 and the second touch electrodes 3, and simultaneously preventing the first touch electrodes 2 and the second touch electrodes 3 from breaking during the flexible deformation.

As shown in FIG. 3, the touch panel of the embodiment of the present disclosure further includes floating electrodes 6 provided on the base substrate 1, wherein the floating electrodes 6 are disposed on a same layer as the first touch electrodes 2 and the second touch electrodes 3, and the floating electrodes 6 are insulated from the first touch electrodes 2 and the second touch electrodes 3. The floating electrodes 6 are used for reducing loads and improving touch performance in case of weak grounding. The floating electrodes 6 may be located in the first touch electrodes 2 and the second touch electrodes 3, wherein the first touch electrodes 2 and the second touch electrodes 3 are routed in peripheral areas of the floating electrodes 6 respectively, and the first touch electrodes 2 and the second touch electrodes 3 form the first bending parts 201 and the second bending part 301 at the floating electrodes 6 respectively. The floating electrodes 6 may also be located in peripheral areas of the first touch electrodes 2 and the second touch electrodes 3.

In some embodiments, the floating electrodes may also be disposed in a different layer from the first touch electrodes and the second touch electrodes. For example, the floating electrodes are disposed on a same layer as the bridging structures.

When touch control is performed on the touch panel of the embodiment of the present disclosure, capacitance of the coupling capacitance area between the first touch electrodes 2 and the second touch electrodes 3 changes, so that an induced signal changes correspondingly, and then a touch position is determined. Herein, one of a first touch electrode 2 and a second touch electrode 3 is a Tx (driving) electrode and the other is an Rx (sensing) electrode, therefore the first touch electrode 2 and the second touch electrode 3 cooperate with each other to complete a touch response. In implementation, the first touch electrode 2 may be the Tx electrode, the second touch electrode 3 may be the Rx electrode, alternatively, the second touch electrode 3 may be the Tx electrode and the first touch electrode 2 may be the Rx electrode.

Figure 4:
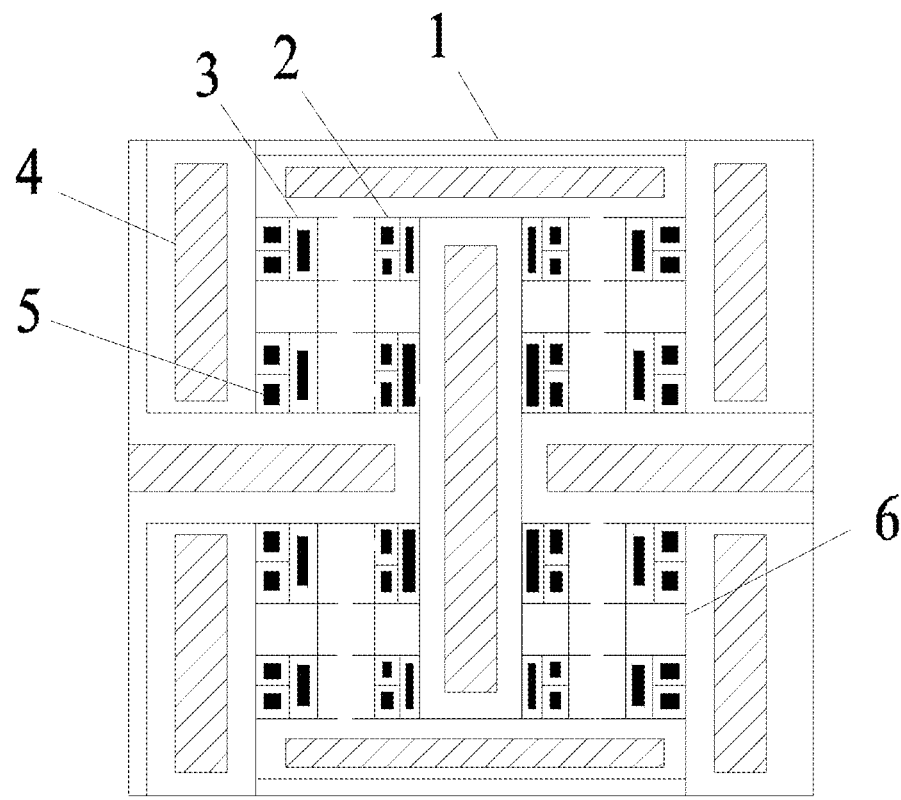
FIG. 4 is a partially enlarged view of a touch panel according to an embodiment of the present disclosure.

FIG. 4 is a partially enlarged diagram view of a touch panel according to an embodiment of the present disclosure. As shown in FIG. 4, each of the first touch electrodes 2 and the second touch electrodes 3 is in a grid structure. The touch panel of the embodiment of the present disclosure further includes multiple sub-pixels 5 provided on the base substrate 1, and the grid structure is provided on the sub-pixels 5. In the grid structure, each grid corresponds to one or one group of sub-pixels 5, wherein an projection of the one or the group of sub-pixels 5 on a plane where the grid is located falls into a corresponding grid, in an RBGB arrangement or pentile arrangement for example, and a shape of the grid may be changed according to the sub-pixels.

Figure 5:
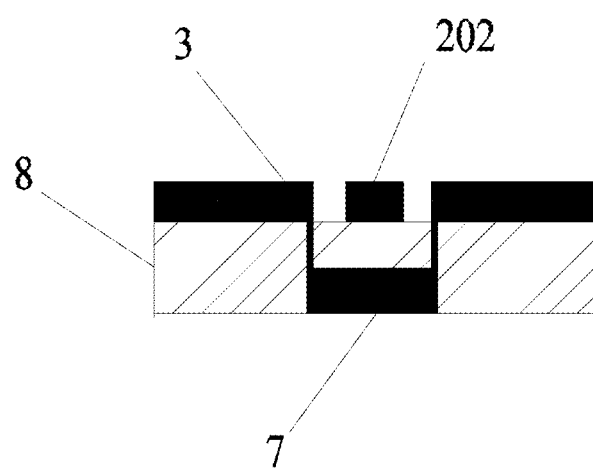
FIG. 5 is a cross sectional view of a bridging structure according to an embodiment of the present disclosure.

FIG. 5 is a cross sectional view of a bridging structure according to an embodiment of the present disclosure. In a plane perpendicular to the base substrate, as shown in FIG. 5, a first touch electrode 2 and a second touch electrode 3 are located on a same side of an insulating layer 8, and a bridging structure 7 is provided on a side of the insulating layer 8 opposite to the side of the insulating layer 8 where the first touch electrode 2 and the second touch electrode 3 are provided, and adjacent second touch electrodes 3 along the first direction are communicated through the bridging structures 7.

In a plane perpendicular to the base substrate, the touch panel of the present disclosure also includes a light-emitting unit provided on the base substrate, and the first touch electrode and the second touch electrode are provided on the light-emitting unit. The light-emitting unit includes a driving structure layer provided on the base substrate and a light-emitting structure layer provided on the driving structure layer, wherein the light-emitting structure layer is used for emitting display light, and the driving structure layer is connected with the light-emitting structure layer and used for controlling and driving the light-emitting structure layer. The driving structure layer mainly includes a pixel driving circuit constituted of multiple Thin Film Transistors (TFTs), and the light-emitting structure layer mainly includes an anode, a light-emitting layer, and a cathode.

Simulation Test

Table 1 shows a stack structure of a common mobile phone. Table 2 shows a simulation result of a single touch unit in a touch panel according to an embodiment of the present disclosure. Herein, a size of a single touch unit in Table 2 is 4200 mm×4200 mm. Compared with the stack structure the common mobile phone shown in Table 1, a simulation for the touch panel of the embodiment of the present disclosure is performed. From the simulation result shown in Table 2, it can be concluded that the touch panel of the embodiment of this disclosure fully meets requirements of a touch chip for a touch structure, taking the laminate structure of the common mobile phone shown in Table 1 as an example.

TABLE 1

Stack structure of common mobile phone Stack

| Layer | thickness | Rs(ohm/sq) | Er |
|---|---|---|---|
| Material 1 | 550 | NA | 7 |
| Material 2 | 50 | NA | 3.6 |
| Material 3 | 65 μm | NA | 3.4 |
| M2 | 0.45 μm | 0.08 | NA |
| Material 4 | 0.35 μm | NA | 6 |
| M2 | 0.2 μm | 0.1 | NA |
| Buffer | 0.35 | NA | 6 |
| Material 5 | 11 μm | NA | 7 |
| Cathode | 0.01 | 10 | NA |

TABLE 2

Simulation result of a single touch unit in the touch panel of the embodiment of this disclosure 5 mm Cylinder Sim. Result

| Touch index | Simulation value | IC spec |
|---|---|---|
| Cs(pF) | 9.05 | — |
| Cm(pF) | 0.82 | 0.5-2 pF |
| dCm(fF) | 0.074 | 5 phi copper column |
| dCm/Cm(%) | 9.02% | >5% |
| Rx/Ry(ohm) | 27/25 | — |

An embodiment of the present disclosure further provides a method for preparing a touch panel. The method for preparing the touch panel of the embodiment of the present disclosure includes:

forming, on a base substrate, multiple first touch electrodes which are provided at intervals and extend along a first direction and multiple second touch electrodes which are provided at intervals and extend along the first direction;

wherein, the first touch electrodes and the second touch electrodes are insulated from each other, and the first touch electrodes and the second touch electrodes cross each other to form a first interdigital structure, and first bending parts extending toward outer side of the first touch electrodes are formed on side parts of the first touch electrodes, alternatively, second bending parts extending toward outer sides of the second touch electrodes are formed on side parts of the second touch electrodes.

An embodiment of the present disclosure further provides a display apparatus including the touch panel according to the embodiments described above. The display apparatus may be any products or components with a display function, such as a mobile phone, a tablet computer, a television, a display, a laptop computer, a digital photo frame, and a navigator, or a product or component with functions of VR, AR and 3D display.

The drawings of the present disclosure only involve the structures involved in the present disclosure, and the other structures may refer to conventional designs. The embodiments in the present disclosure, i.e., the features in the embodiments, may be combined with each other to obtain new embodiments if there is no conflict.

Those of ordinary skills in the art should know that modifications or equivalent replacements may be made to the technical solutions of the present disclosure without departing from the spirit and scope of the technical solutions of the present disclosure, and the modifications or equivalent replacements shall all fall within the scope of the claims of the present disclosure.

The invention claimed is:

1. A touch panel, comprising a base substrate, a plurality of first touch electrodes which are provided on the base substrate and extend along a first direction, and a plurality of second touch electrodes which are provided on the base substrate and extend along the first direction, wherein the plurality of first touch electrodes and the plurality of second touch electrodes are provided at intervals along a second direction and insulated from each other, the plurality of first touch electrodes and the plurality of second touch electrodes cross each other to form a first interdigital structure, wherein a first bending part extending toward outer side is formed on both sides of each of the plurality of first touch electrodes, and a second bending part extending toward outer side is formed on both sides of each of the plurality of second touch electrodes, the first bending part close to a second touch electrode and the second bending part close to a first touch electrode cross each other to form a second interdigital structure, wherein the second direction is perpendicular to the first direction.

2. The touch panel according to claim 1, further comprising a plurality of first connection electrodes which are provided on the base substrate and extend along the second direction, wherein the plurality of first connection electrodes are provided along the first direction at intervals and electrically communicated with the plurality of first touch electrodes respectively, the plurality of first connection electrodes and the plurality of second touch electrodes are insulated from each other.

3. The touch panel according to claim 2, wherein two ends of each of two adjacent first connection electrodes are electrically communicated with two of the plurality of first touch electrodes respectively, forming a loop structure.

4. The touch panel according to claim 1, further comprising a plurality of third connection electrodes which are provided on the base substrate and extend along the second direction, wherein the plurality of third connection electrodes are provided at intervals along the first direction, and electrically communicated with the plurality of second touch electrodes respectively, wherein the plurality of third connection electrode and the plurality of first touch electrodes are insulated from each other.

5. The touch panel according to claim 2, wherein second touch electrodes located at both sides of a first connection electrode are electrically communicated through a bridging structure.

6. The touch panel according to claim 5, wherein at least two bridging structures are provided on the touch panel.

7. The touch panel according to claim 1, wherein both the first touch electrodes and the second touch electrodes are in a grid structure.

8. The touch panel according to claim 7, further comprising a plurality of sub-pixels provided on the base substrate, wherein the grid structure is provided on the sub-pixels, in the grid structure, each grid corresponds to one or one group of sub-pixels, and a projection of the one or the group of sub-pixels on a plane where the grid is located falls within a corresponding grid.

9. A display apparatus, comprising the touch panel according to claim 1.

10. A method for preparing a touch panel, comprising:
forming, on a base substrate, a plurality of first touch electrodes extending along a first direction and a plurality of second touch electrodes extending along the first direction;
wherein the plurality of first touch electrodes and the plurality of second touch electrodes are provided at intervals along a second direction and insulated from each other, and the plurality of first touch electrodes and the plurality of second touch electrodes cross each other to form a first interdigital structure; wherein a first bending part extending toward outer side is formed on both sides of each of the plurality of first touch electrodes, and a second bending part extending toward outer side is formed on both sides of each of the plurality of second touch electrodes, the first bending part close to a second touch electrode and the second bending part close to a first touch electrode cross each other to form a second interdigital structure, wherein the second direction is perpendicular to the first direction.

11. The touch panel according to claim 1, wherein the first bending part is a convex part on both sides of the first touch electrode and the second bending part is a convex part on both sides of the second touch electrode.

12. The touch panel according to claim 1, wherein the first bending part extends along with the first touch electrode in the first direction, and the second bending part extends along with the second touch electrode in the first direction.

* * * * *